United States Patent [19]
Daniel et al.

[11] Patent Number: 6,121,147
[45] Date of Patent: Sep. 19, 2000

[54] APPARATUS AND METHOD OF DETECTING A POLISHING ENDPOINT LAYER OF A SEMICONDUCTOR WAFER WHICH INCLUDES A METALLIC REPORTING SUBSTANCE

[75] Inventors: David W. Daniel, Divide; John W. Gregory; Derryl D. J. Allman, both of Colorado Springs, all of Colo.

[73] Assignee: LSI Logic Corporation, Milpitas, Calif.

[21] Appl. No.: 09/209,704

[22] Filed: Dec. 11, 1998

[51] Int. Cl.⁷ ..................................................... H01L 21/00
[52] U.S. Cl. .............................. 438/692; 216/84; 216/88; 438/747; 438/753; 438/8; 438/14
[58] Field of Search ..................................... 438/691, 692, 438/693, 745, 747, 753, 8, 14; 216/38, 84, 85, 88, 89, 91; 156/345 LC, 345 LP

[56] References Cited

U.S. PATENT DOCUMENTS

| | | | |
|---|---|---|---|
| 3,734,620 | 5/1973 | Cade | 356/73 |
| 3,748,014 | 7/1973 | Beiser | 350/6 |
| 4,312,732 | 1/1982 | Degenkolb et al. | 204/192 |
| 4,374,915 | 2/1983 | Ahlquist et al. . | |
| 4,632,724 | 12/1986 | Chesebro et al. . | |
| 4,689,491 | 8/1987 | Lindow et al. | 250/572 |
| 4,793,895 | 12/1988 | Kaanta et al. | 156/627 |
| 5,036,015 | 7/1991 | Sandhu et al. | 437/8 |
| 5,081,421 | 1/1992 | Miller et al. | 324/671 |
| 5,151,584 | 9/1992 | Ebbing et al. | 250/201.4 |
| 5,169,491 | 12/1992 | Doan | 156/636 |
| 5,196,353 | 3/1993 | Sandhu et al. | 437/8 |
| 5,222,329 | 6/1993 | Yu | 51/165.77 |
| 5,240,552 | 8/1993 | Yu et al. | 156/636 |
| 5,242,524 | 9/1993 | Leach et al. | 156/345 LC |
| 5,245,790 | 9/1993 | Jerbic . | |
| 5,245,794 | 9/1993 | Salugsugan | 51/165.74 |
| 5,258,093 | 11/1993 | Maniar . | |
| 5,265,378 | 11/1993 | Rostoker | 51/165.75 |
| 5,272,115 | 12/1993 | Sato | 437/228 |
| 5,308,438 | 5/1994 | Cote et al. | 156/636 |
| 5,310,455 | 5/1994 | Pasch et al. . | |
| 5,321,304 | 6/1994 | Rostoker . | |
| 5,337,015 | 8/1994 | Lustig et al. | 324/671 |
| 5,362,669 | 11/1994 | Boyd et al. . | |
| 5,385,866 | 1/1995 | Bartush . | |
| 5,389,194 | 2/1995 | Rostoker et al. . | |
| 5,399,234 | 3/1995 | Yu et al. | 156/636 |
| 5,403,228 | 4/1995 | Pasch . | |
| 5,405,806 | 4/1995 | Pfiester et al. | 437/200 |
| 5,439,551 | 8/1995 | Meikle et al. | 156/626.1 |
| 5,449,314 | 9/1995 | Meikle et al. . | |
| 5,483,568 | 1/1996 | Yano et al. | 378/44 |
| 5,492,594 | 2/1996 | Burke et al. | 216/86 |
| 5,516,400 | 5/1996 | Pasch et al. . | |

(List continued on next page.)

*Primary Examiner*—William Powell

[57] ABSTRACT

A method of planarizing a semiconductor wafer to a distance from a semiconductor substrate of the wafer is disclosed. The method includes the step of forming in the wafer a metallic reporting substance that is at the predetermined distance from the substrate of the wafer. The method also includes the step of polishing a first side of the wafer in order to remove material from the wafer. The method further includes the step of utilizing an atomic absorption spectroscopic technique to detect the presence of the metallic reporting substance in the material removed from the wafer. Moreover, the method includes the step of terminating the polishing step in response to the detection of the metallic reporting substance. An associated apparatus for polishing a semiconductor wafer down to a metallic reporting substance of the wafer is also described.

20 Claims, 3 Drawing Sheets

U.S. PATENT DOCUMENTS

| | | | |
|---|---|---|---|
| 5,531,861 | 7/1996 | Yu et al. | 156/636.1 |
| 5,559,428 | 9/1996 | Li et al. | 324/71.5 |
| 5,561,541 | 10/1996 | Sharp et al. | 359/66 |
| 5,595,526 | 1/1997 | Yau et al. | 451/8 |
| 5,597,442 | 1/1997 | Chen et al. | 156/626.1 |
| 5,597,590 | 1/1997 | Tanimoto et al. . | |
| 5,607,341 | 3/1997 | Leach | 451/41 |
| 5,609,511 | 3/1997 | Moriyama et al. | 451/5 |
| 5,614,446 | 3/1997 | Ramaswami et al. . | |
| 5,624,304 | 4/1997 | Pasch et al. . | |
| 5,626,715 | 5/1997 | Rostoker . | |
| 5,627,110 | 5/1997 | Lee et al. . | |
| 5,637,185 | 6/1997 | Murarka et al. | 438/5 |
| 5,639,388 | 6/1997 | Kimura et al. | 216/84 |
| 5,643,046 | 7/1997 | Katakabe et al. | 451/6 |
| 5,643,050 | 7/1997 | Chen | 451/10 |
| 5,643,061 | 7/1997 | Jackson et al. | 451/289 |
| 5,644,221 | 7/1997 | Li et al. | 324/71.5 |
| 5,645,682 | 7/1997 | Skrovan . | |
| 5,647,952 | 7/1997 | Chen | 156/636.1 |
| 5,656,229 | 8/1997 | Tanimoto et al. . | |
| 5,658,183 | 8/1997 | Sandhu et al. | 451/5 |
| 5,660,672 | 8/1997 | Li et al. | 156/345 |
| 5,663,101 | 9/1997 | Cronin . | |
| 5,663,797 | 9/1997 | Sandhu | 438/16 |
| 5,664,987 | 9/1997 | Rentein | 451/21 |
| 5,667,424 | 9/1997 | Pan | 451/6 |
| 5,667,433 | 9/1997 | Mallon . | |
| 5,667,629 | 9/1997 | Pan et al. | 438/13 |
| 5,668,063 | 9/1997 | Fry et al. | 438/5 |
| 5,670,410 | 9/1997 | Pan | 437/60 |
| 5,672,091 | 9/1997 | Takahashi et al. | 451/6 |
| 5,674,784 | 10/1997 | Jang et al. | 437/195 |
| 5,681,215 | 10/1997 | Sherwood | 568/215 |
| 5,691,253 | 11/1997 | Kobayashi . | |
| 5,695,660 | 12/1997 | Litvak | 216/85 |
| 5,700,180 | 12/1997 | Sandhu et al. | 451/5 |
| 5,702,292 | 12/1997 | Brunelli et al. . | |
| 5,704,987 | 1/1998 | Huynh et al. . | |
| 5,705,320 | 1/1998 | Hsu et al. . | |
| 5,705,435 | 1/1998 | Chen | 438/8 |
| 5,710,076 | 1/1998 | Dai et al. | 438/305 |
| 5,712,185 | 1/1998 | Tsai et al. | 437/67 |
| 5,716,873 | 2/1998 | Prall et al. . | |
| 5,720,845 | 2/1998 | Liu . | |
| 5,722,875 | 3/1998 | Iwashita et al. | 451/8 |
| 5,722,877 | 3/1998 | Meyer et al. . | |
| 5,725,417 | 3/1998 | Robinson . | |
| 5,736,462 | 4/1998 | Takahashi et al. . | |
| 5,738,567 | 4/1998 | Manzonie et al. . | |
| 5,741,171 | 4/1998 | Sarfaty et al. | 451/6 |
| 5,747,380 | 5/1998 | Yu et al. . | |
| 5,755,614 | 5/1998 | Adams et al. . | |
| 5,762,536 | 6/1998 | Pant et al. . | |
| 5,762,537 | 6/1998 | Sandhu et al. . | |
| 5,777,739 | 7/1998 | Sandhu et al. | 356/357 |
| 5,795,495 | 8/1998 | Meikle . | |
| 5,861,055 | 1/1999 | Allman et al. . | |
| 5,865,666 | 2/1999 | Nagahara . | |
| 5,868,608 | 2/1999 | Allman et al. . | |
| 5,882,244 | 3/1999 | Hiyama et al. . | |
| 5,882,251 | 3/1999 | Berman et al. . | |
| 5,888,120 | 3/1999 | Doran . | |
| 5,893,756 | 4/1999 | Berman et al. . | |
| 5,931,719 | 8/1999 | Nagahara et al. . | |
| 5,948,697 | 9/1999 | Hata . | |
| 5,957,757 | 9/1999 | Berman . | |
| 5,985,679 | 11/1999 | Berman | 438/8 X |

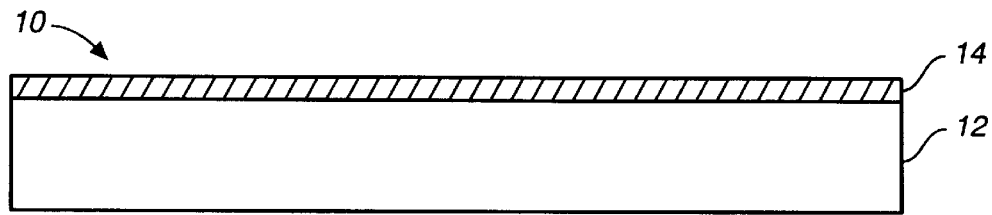
FIG._1A
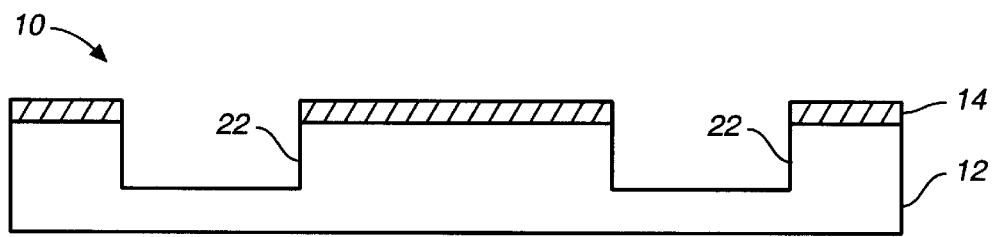
FIG._1B
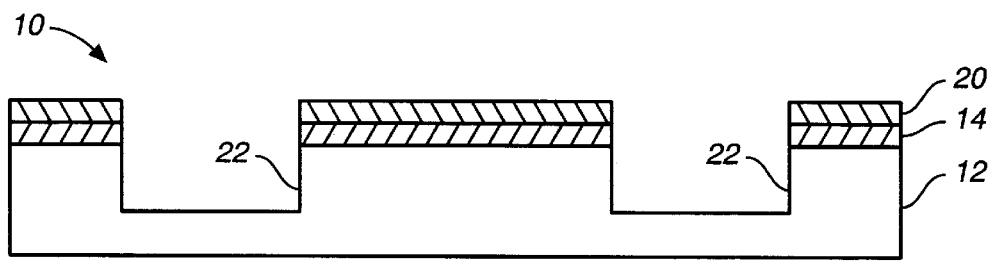
FIG._1C
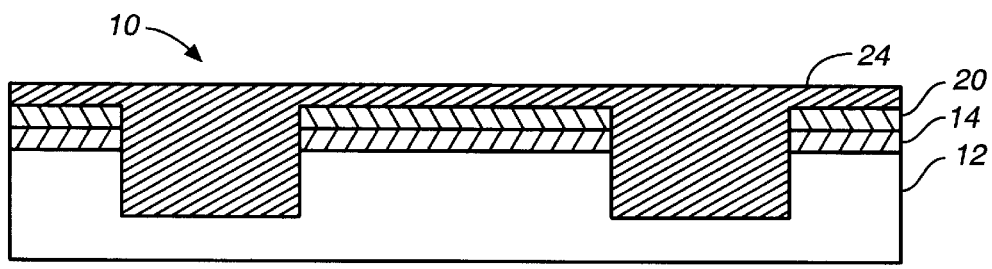
FIG._1D
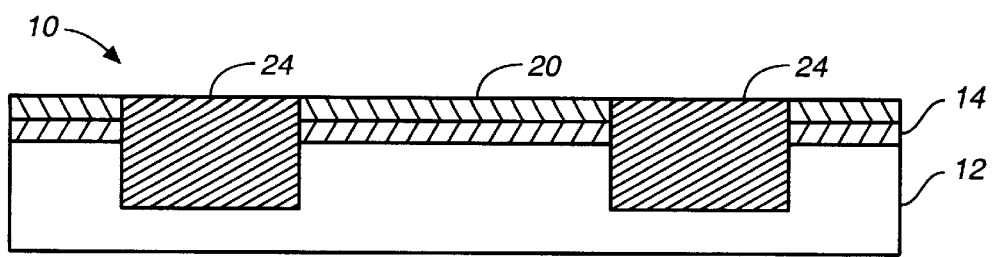
FIG._1E

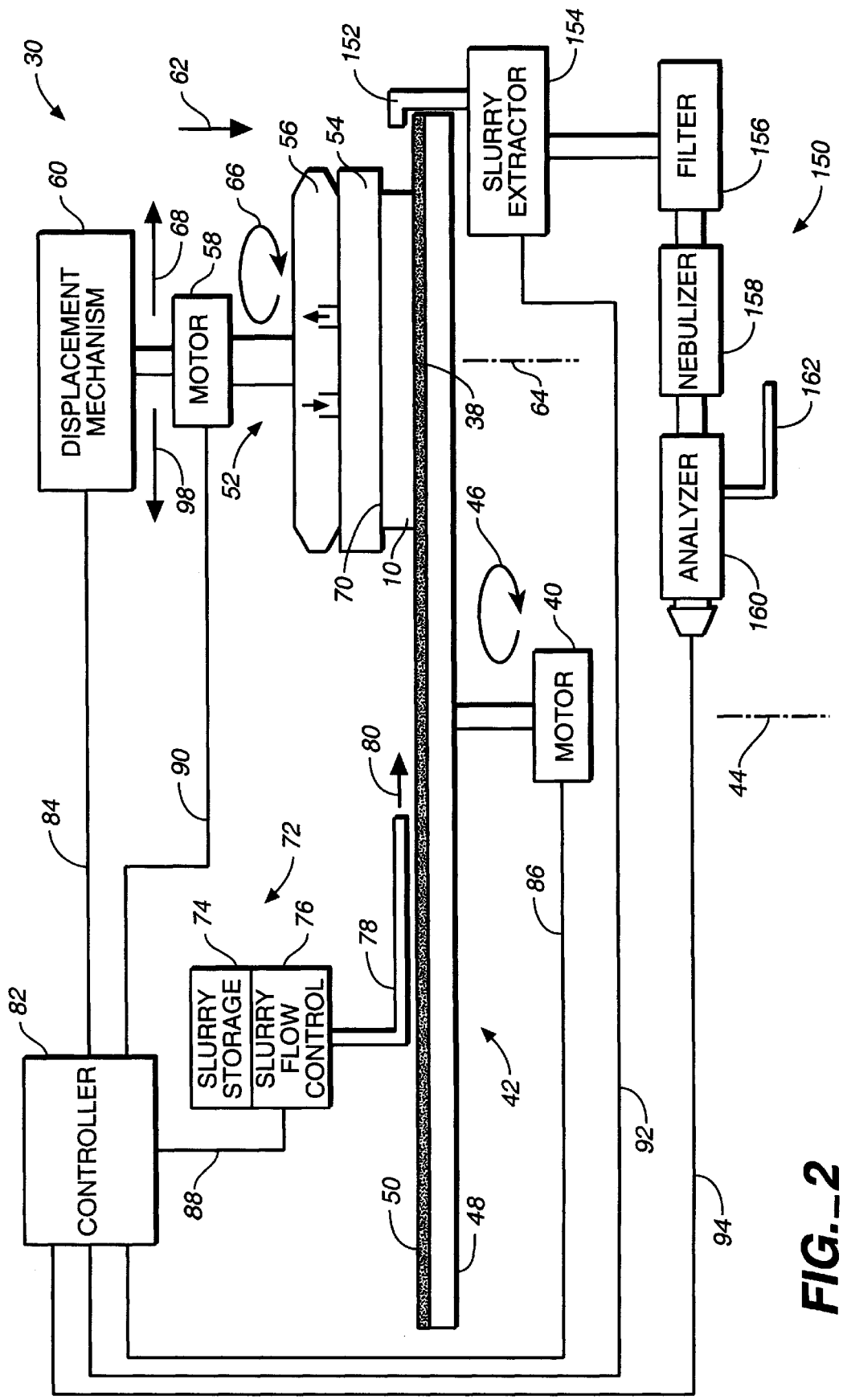
FIG._2

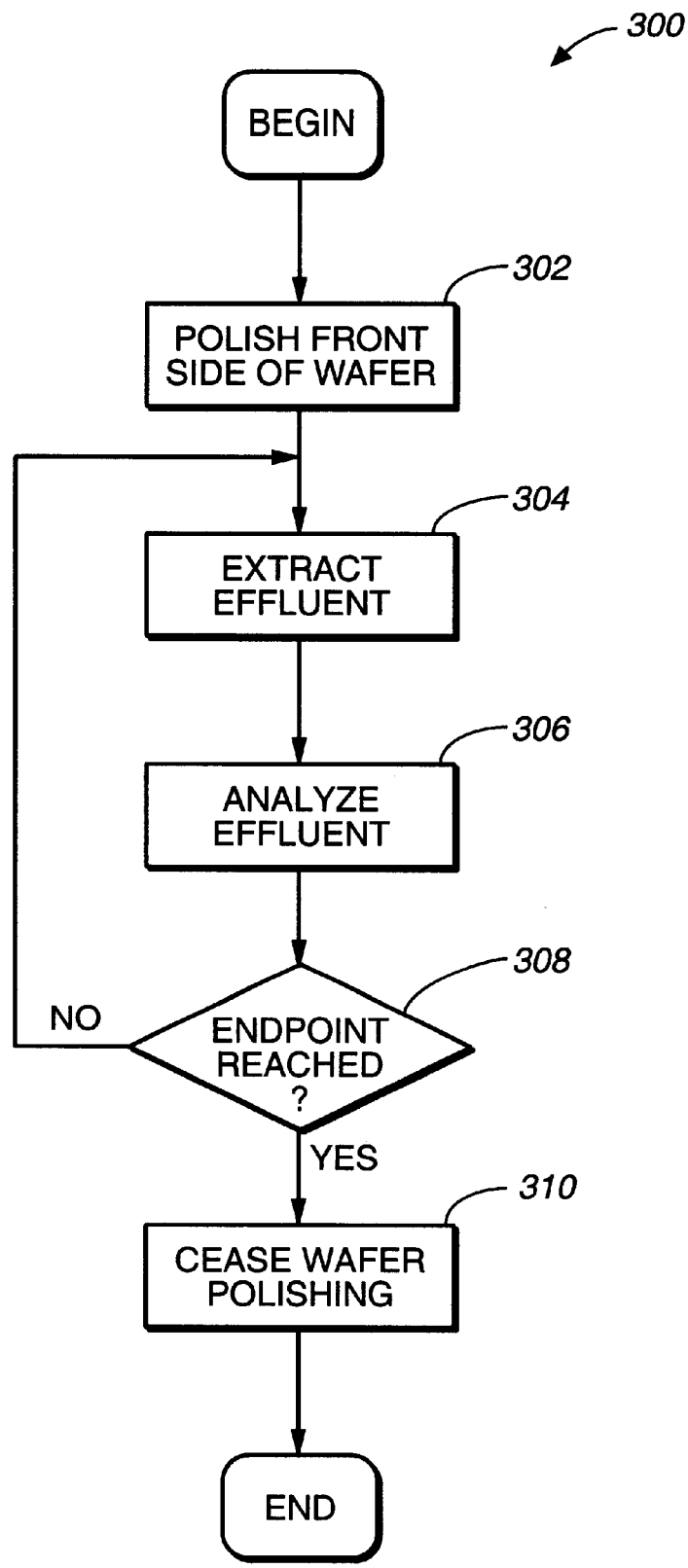
FIG._3

APPARATUS AND METHOD OF DETECTING A POLISHING ENDPOINT LAYER OF A SEMICONDUCTOR WAFER WHICH INCLUDES A METALLIC REPORTING SUBSTANCE

TECHNICAL FIELD OF THE INVENTION

The present invention relates generally to a method of detecting a polishing endpoint layer of a semiconductor wafer, and more particularly to an apparatus and method of detecting a polishing endpoint layer of a semiconductor wafer which includes a metallic reporting substance.

BACKGROUND OF THE INVENTION

Semiconductor integrated circuits are typically fabricated by a layering process in which several layers of material are fabricated on or in a surface of a wafer, or alternatively, on a surface of a previous layer. This fabrication process typically requires subsequent layers to be fabricated upon a smooth, planar surface of a previous layer. However, the surface topography of layers may be uneven due to an uneven topography associated with an underlying layer. As a result, a layer may need to be polished in order to present a smooth, planar surface for a subsequent processing step. For example, a layer may need to be polished prior to formation of a conductor layer or pattern on an outer surface of the layer.

In general, a semiconductor wafer may be polished to remove high topography and surface defects such as crystal lattice damage, scratches, roughness, or embedded particles of dirt or dust. The polishing process typically is accomplished with a polishing system that includes top and bottom platens (e.g. a polishing table and a wafer carrier or holder), between which the semiconductor wafer is positioned. The platens are moved relative to each other thereby causing material to be removed from the surface of the wafer. This polishing process is often referred to as mechanical planarization (MP) and is utilized to improve the quality and reliability of semiconductor devices. The polishing process may also involve the introduction of a chemical slurry to facilitate higher removal rates, along with the selective removal of materials fabricated on the semiconductor wafer. This polishing process is often referred to as chemical mechanical planarization or chemical mechanical polishing (CMP).

In these polishing processes, it is often important to determine an endpoint of the polishing process. Overpolishing (removing too much) of a conductive layer results in increased circuit resistance and potential scrapping of the semiconductor wafer. Since many processing steps have occurred prior to the polishing process, scrapping a semiconductor wafer during fabrication may undesirably result in significant financial loss. Underpolishing (removing too little) of a conductive layer on the other hand leads to failure in isolating circuits and results in electrical shorts. Presence of such electrical shorts leads to rework (redoing the CMP process) thereby disadvantageously increasing costs (e.g. production costs) associated with the semiconductor wafer. Thus, a precise endpoint detection technique is needed.

A typical method employed for determining the endpoint in polishing systems is to measure the amount of time needed to planarize a first wafer, and thereafter polishing the remaining wafers for a similar amount of time. In practice this method is extremely time consuming since machine operators must inspect each wafer after polishing. In particular, it is extremely difficult to precisely control the removal rate of material since the removal rate may vary during the polishing of an individual wafer. Moreover, the removal rate may be diminished in the process of polishing a number of wafers in sequence.

Thus, a continuing need exists for a method and an apparatus which accurately and efficiently detects when a polishing system polishes a semiconductor device down to a polishing endpoint layer.

SUMMARY OF THE INVENTION

In accordance with one embodiment of the present invention, there is provided a method of planarizing a semiconductor wafer having a polishing endpoint layer that includes a metallic reporting substance. The method includes the step of polishing a first side of the wafer in order to remove material from the wafer. The method also includes the step of utilizing an atomic absorption technique to detect the presence of the metallic reporting substance in the material removed from the wafer. The method further includes the step of terminating the polishing step in response to detecting the presence of the metallic reporting substance.

Pursuant to another embodiment of the present invention, there is provided a method of planarizing a semiconductor wafer down to a distance from a semiconductor substrate of the wafer. The method includes the step of forming in the wafer a metallic reporting substance that is at the distance from the substrate of the wafer. The method also includes the step of polishing a first side of the wafer in order to remove material from the wafer. The method further includes the step of utilizing an atomic absorption spectroscopic technique to detect the presence of the metallic reporting substance in the material removed from the wafer. Moreover, the method includes the step of terminating the polishing step in response to the detection of the metallic reporting substance.

Pursuant to yet another embodiment of the present invention, there is provided an apparatus for polishing a semiconductor wafer down to a metallic reporting substance of the wafer, wherein the wafer has a first side and a second side. The apparatus includes a polishing platen having a polishing surface. The apparatus also includes a wafer carrier configured to (i) engage the wafer by the second side of the wafer and (ii) press the first side of the wafer against the polishing surface of the polishing platen. The apparatus further includes a slurry supply system configured to apply a chemical slurry to the first side of the wafer which (i) facilities removal of the metallic reporting substance from the wafer, and (ii) receives the metallic reporting substance removed from the wafer, wherein the polishing platen and the wafer carrier are configured to rub the first side of the wafer against the polishing surface in the presence of the chemical slurry in order to remove the metallic reporting substance from the wafer. The apparatus also includes a polishing endpoint detector that (i) utilizes an atomic absorption spectroscopic technique to detect the presence of the metallic reporting substance in the material removed from the wafer, and (ii) is operable so as to cause the polishing of the wafer to terminate in response to detecting the presence of the metallic reporting substance.

It is an object of the present invention to provide a new and useful apparatus and method for detecting an endpoint layer of a polishing process.

It is an object of the present invention to provide an improved apparatus and method for detecting an endpoint layer of a polishing process.

It is a further object of the present invention to provide an apparatus and method for determining that a polishing system has polished a wafer down to a polishing endpoint without removing the wafer from the polishing system.

The above and other objects, features, and advantages of the present invention will become apparent from the following description and the attached drawings.

BRIEF DESCRIPTION OF THE DRAWINGS

FIGS. 1A–1E show sectional views of a semiconductor wafer during various steps of a fabrication process;

FIG. 2 shows an embodiment of a polishing system which incorporates various features of the present invention therein; and FIG. 3 shows a flowchart of a polishing procedure used by the polishing system of FIG. 2.

DETAILED DESCRIPTION OF A PREFERRED EMBODIMENT

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Referring now to FIGS. 1A–1E, there is shown a semiconductor wafer 10 after various steps of a fabrication process of the present invention. In particular, FIGS. 1A and 1B show the semiconductor wafer 10 after a number of fabrication steps. The semiconductor wafer 10 includes a semiconductor substrate 12, such as silicon. A first insulating layer 14 is deposited or otherwise disposed on the semiconductor substrate 12. In particular, the fabrication process deposits an insulating material, such as silicon nitride, over the substrate 12 as shown in FIG. 1A.

Thereafter, as shown in FIG. 1B, a number of trenches 22 are etched or otherwise formed in the semiconductor wafer 12. The trenches 22 may be formed by first applying a photo-resist or other type of etching mask to the desired areas of the semiconductor wafer 10 and thereafter chemically etching the unmasked areas of the first insulating layer 14 and the substrate 12. Such etching masks and techniques for use thereof are commonly known in the art.

As shown in FIG. 1C, once the trenches 22 have been formed, the fabrication process deposits a polishing endpoint layer 20 over the first insulating layer 14. The material associated with the polishing endpoint layer 20 preferably includes a metallic reporting substance. What is meant herein by a metallic reporting substance is a material which includes a metallic element that is distinguishable from a nonmetallic element by their respective positions in a periodic table (or chart). In particular, metallic elements are located on the left side and nonmetallic elements are located on the right side of a line which divides the periodic table into the metallic and nonmetallic elements. Moreover, metallic elements are distinguishable from nonmetallic elements by the luster, electrical conductivity, and malleability of the metallic element as compared to a nonmetallic element. In addition, a metallic element is distinguishable from a nonmetallic element by the ability of the metallic element to form positive ions. In particular, the polishing endpoint layer 20 may include metallic elements such as tungsten, aluminum, titanium, copper, lead, iron, gold, silver, or any other metallic element capable of being detected by atomic absorption spectroscopy.

The polishing endpoint layer 20 may be deposited on the semiconductor wafer 10 with any one of a number of know techniques. For example, once the trenches 22 have been formed in the semiconductor wafer 10, the wafer 10 is typically chemically cleaned in order to remove any residual photo-resist from the etching process. By selecting a chemical which includes a metallic reporting substance, the polishing endpoint layer 20 may be deposited on the first insulating layer 14 via wet chemistry deposition.

As shown in FIG. 1D, once the polishing endpoint layer 20 is formed in the semiconductor wafer 10, a second insulating layer 24 is deposited on the semiconductor wafer 10. In particular, the second insulating layer 24 is deposited on the polishing endpoint layer 20 and the first insulating layer 14. Deposition of the second insulating layer 24 also causes the trenches 22 to be filled with the material of the second insulating layer 24. Typically, the material of the second insulating layer is a glass such as silicon dioxide.

Thereafter, as shown in FIG. 1E, a polishing system, such as a polishing system 30 of FIG. 2, polishes the second insulating layer 24 down to the polishing endpoint layer 20 thereby planarizing the surface of the second insulating layer 24. Such planarization of the second insulating layer 24 facilitates subsequent processes associated with fabrication of the semiconductor wafer 10.

Referring now to FIG. 2, there is shown a preferred embodiment of the polishing system 30 which is used to planarize a front side or surface 38 of the semiconductor wafer 10. The polishing system 30 includes a platen motor or other drive mechanism 40 and a platen assembly 42. The platen motor 40 rotates the platen assembly 42 about a center axis 44. The platen motor 40 may rotate the platen assembly 42 in a clockwise direction (as shown by arrow 46 of FIG. 2) or in the counterclockwise direction.

The platen assembly 42 includes a polishing platen 48 and a polishing pad 50 mounted on the polishing platen 48. Both the polishing platen 48 and the polishing pad 50 are preferably circular and collectively define a polishing area or surface against which the front side 38 of the semiconductor wafer 10 may be polished. Moreover, the polishing pad 50 is typically made of blown polyurethane which protects the polishing platen 48 from chemical slurry and other chemicals introduced during the polishing process.

The polishing system 30 also includes a polishing head assembly 52. The polishing head assembly 52 includes a wafer carrier 54, a cooling mechanism 56, a wafer carrier motor or other drive mechanism 58, and a wafer carrier displacement mechanism 60. The wafer carrier 54 applies a controlled, adjustable force in the general direction of arrow 62 in order to press the front side 38 of the semiconductor wafer 10 into contact with the polishing pad 50 so as to facilitate polishing of the front side 38 of the semiconductor wafer 10.

The wafer carrier motor 58 rotates the wafer carrier 54 and the semiconductor wafer 10 about a center axis 64. The wafer carrier motor 58 may rotate the wafer carrier 54 in a clockwise direction (as shown by arrow 66 of FIG. 2) or in the counterclockwise direction. However, the wafer carrier motor 58 preferably rotates the wafer carrier 54 in the same rotational direction as the platen motor 40 rotates the platen assembly 42 (although the wafer carrier motor 58 may rotate the semiconductor wafer 10 in the rotational direction opposite the rotational direction of the platen assembly 42 as desired).

The wafer carrier 54 also includes mechanisms (not shown) for holding the semiconductor wafer 10. For example, the wafer carrier 54 may include a vacuum-type mechanism which generates a vacuum force that draws the semiconductor wafer 10 against the wafer carrier 54. Once the semiconductor wafer 10 is positioned on the wafer carrier 54 and held in contact with the platen assembly 42 for polishing, the vacuum force may be removed. In such an arrangement, the wafer carrier 54 may be designed with a friction surface or a carrier pad which engages a back side 70 of the semiconductor wafer 10. Such a carrier pad, along with the force being applied in the general direction of arrow 62, creates a frictional force between the wafer carrier 54 and the semiconductor wafer 10 that effectively holds the semiconductor wafer 10 against the wafer carrier 54 thereby causing the semiconductor wafer 10 to rotate at the same velocity as the wafer carrier 54. It should be appreciated that such wafer carriers and carrier pads are of conventional design and are commercially available.

The cooling mechanism 56 counteracts heat generated during the polishing process in order to maintain the wafer carrier 54 at a substantially constant temperature. In particular, the cooling mechanism 56 neutralizes the heat generated due to friction and a chemical slurry reacting with the front side 38 of the semiconductor wafer 10.

The displacement mechanism 60 selectively moves the wafer carrier 54 and hence the semiconductor wafer 10 across the platen assembly 42 in the general direction of arrows 68 and 98. Such movement defines a polishing path which may be linear, sinusoidal, or a variety of other patterns. The wafer carrier displacement mechanism 60 is also capable of moving the semiconductor wafer 10 along a polishing path to a location beyond the edge of the polishing pad 50 so that the semiconductor wafer 10 "overhangs" the edge. Such an overhanging arrangement permits the semiconductor wafer 10 to be moved partially on and partially off the polishing pad 50 to compensate for polishing irregularities caused by a relative velocity differential between the faster moving outer portions and the slower moving inner portions of the platen assembly 42.

The polishing system 30 also includes a chemical slurry system 72. The slurry system 72 includes a slurry storage reservoir 74, a slurry flow control mechanism 76, and a slurry conduit 78. The slurry storage reservoir 74 includes one or more containers for storing slurry. In particular, the slurry storage reservoir 74 contains a chemical slurry that includes abrasive material which facilitates polishing of the front side 38 of the semiconductor wafer 10. Chemical slurries having such properties are well known and commercially available.

The slurry flow control mechanism 76 controls the flow of slurry from the slurry storage 74, through the slurry conduit 78, and onto the polishing area atop the platen assembly 42. Hence, the slurry flow control mechanism 76 and the slurry conduit 78 selectively introduce a flow of slurry (as indicated by arrow 80) atop the polishing pad 50.

The polishing system 30 also includes an endpoint detection system 150. The endpoint detection system 150 includes an extraction conduit 152, an extraction flow control mechanism 154, a filter mechanism 156, a nebulizer 158, an analyzer 160, and a waste conduit 162. The extraction conduit 152 receives effluent from the polishing area atop platen assembly 42. The effluent may include the chemical slurry from the slurry supply system 72 and materials removed from the semiconductor wafer 10. The extraction flow control mechanism 154 controls the flow of effluent from the extraction conduit 152 to the filter mechanism 156, the nebulizer 158, and thereafter the analyzer 160.

The filter mechanism 156 includes a membrane which filters various known and unknown solids from the effluent flow in order to prevent such solids from reaching the nebulizer 158. In a preferred embodiment, the membrane of the extraction flow control mechanism 154 has a pore size that is slightly smaller than the alumina included in the chemical slurry.

The nebulizer 158 is provided to convert the effluent into a suitable medium for presentation to the analyzer 160. In particular, the nebulizer 158 converts the effluent from a liquid to a fine spray or otherwise atomizes the effluent prior to introduction of the same into the analyzer 160.

The waste conduit 162 of the endpoint detection system 150 connects the analyzer 160 to a waste treatment facility (not shown) in order to chemically treat or otherwise properly dispose of the effluent subsequent to analyzation thereof.

The analyzer 160 is operable to analyze the effluent and generate an endpoint detection signal when the effluent has a particular characteristic that is indicative of the polishing endpoint layer 20 being reached. To this end, the analyzer 160 is operable to determine whether the effluent from the polishing area atop platen assembly 42 includes detectable amounts of the metallic reporting substance of polishing endpoint layer 20. For example, in the case of when the metallic reporting substance of polishing endpoint layer 20 includes tungsten, the analyzer 160 is operable to detect the presence of tungsten in the effluent from the polishing area atop platen assembly 42. Preferably, analyzer 160 utilizes an atomic absorption spectroscopic technique to detect the presence of the metallic reporting substance in the effluent from the polishing area atop platen assembly 42. More preferably, analyzer 160 includes a flame atomic absorption spectrometer or a flameless atomic absorption spectrometer for determining the presence of the metallic reporting substance in the effluent from the polishing area atop platen assembly 42. Atomic absorption spectroscopy techniques which utilize the above described atomic absorption spectrometers are well known in the art. Accordingly, atomic absorption spectroscopy techniques are not described herein.

The polishing system 30 also includes a controller 82 for controlling the polishing system 30 in order to effectuate the desired polishing results for the semiconductor wafer 10. In particular, the controller 82 is electrically coupled to the displacement mechanism 60 via a signal line 84 to monitor and controllably adjust the polishing path of the semiconductor wafer 10 and the speed at which the semiconductor wafer 10 is moved across the platen assembly 42.

Moreover, the controller 82 is electrically coupled to the platen motor 40 via a signal line 86 in order to monitor the output speed of the platen motor 40 and hence the rotational velocity of the platen assembly 42. The controller 82 adjusts the output speed of the platen motor 40 and hence the rotational velocity of the platen assembly 42 as required by predetermined operating parameters.

The controller 82 is electrically coupled to the slurry flow control mechanism 76 via a signal line 88 in order to monitor the flow rate of the chemical slurry onto the polishing pad 50 of the platen assembly 42. The controller 82 adjusts the flow rate of the chemical slurry onto the polishing pad 50 of the platen assembly 42 as required by predetermined operating parameters.

The controller 82 is electrically coupled to the wafer carrier motor 58 via a signal line 90 in order to monitor the output speed of the wafer carrier motor 58 and hence the rotational velocity of the wafer carrier 54. The controller 82 adjusts the output speed of the wafer carrier motor 58 and hence the rotational velocity of the wafer carrier 54 as required by predetermined operating parameters.

The controller 82 is electrically coupled to the extraction flow control mechanism 154 via a signal line 92 in order to monitor the flow rate of the effluent from the polishing area of the platen assembly 42 to the filter mechanism 156 (and hence the nebulizer 158 and the analyzer 160). The controller 82 adjusts the flow rate of the effluent from the polishing area of the platen assembly 42 as required by predetermined operating parameters.

The controller 82 is also electrically coupled to the analyzer 160 of the endpoint detection system 150 via a signal line 94 to monitor the endpoint detection signal generated by the analyzer 160. In particular, when the analyzer 160 detects the presence of the metallic reporting substance, the analyzer 160 can generate an endpoint detection signal which is communicated to the controller 82 via the signal line 94.

However, it should be understood that preferably, analyzer 160 is also operable to detect a change in the concentration of the metallic reporting substance in the effluent removed from atop platen assembly 42. Having analyzer 160 operable to detect a change in the concentration of the metallic reporting substance is advantageous because as semiconductor wafer 10 is polished down to the polishing end point layer 20 the concentration of metallic reporting substance in the effluent removed from atop platen assembly 42 will initially increase to a maximum, and then begin to decrease as the polishing end point layer 20 is gradually removed from semiconductor wafer 10. Therefore, the analyzer 160 can be programmed so as to generate the endpoint detection signal based upon a predetermined change in the concentration of the metallic reporting substance. Generating the endpoint detection signal based upon a predetermined change in the concentration of the metallic reporting substance results in having greater flexibility and control over when the polishing process is stopped. For example, the analyzer 160 can be programmed to generate the end point detection signal when the analyzer 160 detects a decrease in the concentration (or a disappearance) of the metallic reporting substance in the effluent removed from atop platen assembly 42. Generating the end point detection signal when the analyzer 160 detects a decrease in the concentration of the metallic reporting substance allows the polishing process to proceed for a longer period of time, and therefore results in a greater proportion of the polishing end point layer 20 being removed from the semiconductor wafer 10. Alternatively, the analyzer 160 can be programmed to generate the end point detection signal when the analyzer 160 detects an increase in the concentration of the metallic reporting substance in the effluent removed from atop platen assembly 42. Generating the end point detection signal when the analyzer 160 detects an increase in the concentration of the metallic reporting substance shortens the time the polishing process is allowed to proceed, and therefore results in a smaller proportion of the polishing end point layer 20 being removed from the semiconductor wafer 10. Either one of these alternatives may be advantageous depending upon the circumstances, e.g. the type of semiconductor being polished or the process being used to fabricate the semiconductor.

In operation, the polishing system 30 polishes the semiconductor wafer 10 in order to planarize the front side 38 thereof. In particular, the polishing system 30 removes material from the front side 38 of the semiconductor wafer 10 until the wafer 10 is polished down to the polishing endpoint layer 20. More specifically, the wafer carrier 54 engages the back side 70 of the semiconductor wafer 10 and presses the front side 38 of the semiconductor wafer 10 against the polishing pad 50. The controller 82 then causes the platen motor 40 to rotate the platen assembly 42 and the wafer carrier motor 58 to rotate the wafer carriers 54. The controller 82 may also begin to control the displacement mechanism 60 so as to move the wafer carrier 54 along a predetermined polishing path. The slurry flow control mechanism 76 is also controlled by the controller 82 in order to apply chemical slurry to the polishing pad 50 at a predetermined flow rate. The resulting complex movement of the wafer carrier 54 relative to the polishing pad 50, the force being applied to the semiconductor wafer 10 in the general direction of arrow 62 of FIG. 2, and the chemical slurry all cooperate to selectively remove material from the front side 38 of the semiconductor wafer 10.

In addition, the controller 82 causes the extraction flow control mechanism 154 to extract effluent from the polishing area of the platen assembly 42 thereby causing effluent to flow through the filter mechanism 156 and into the nebulizer 158. The liquid effluent is then converted to a fine spray or otherwise atomized by the nebulizer 158 and advanced into the analyzer 160 of the endpoint detection system 150. The analyzer 160 generates an endpoint detection signal once the analyzer 160 detects the presence of the metallic reporting substance associated with the polishing endpoint layer 20. Alternatively, as previously discussed, analyzer 160 can also be programmed to generate an endpoint detection signal once the analyzer 160 detects a change in the concentration of the metallic reporting substance in the effluent from the polishing area of the platen assembly 42. In response to the analyzer 160 generating the endpoint detection signal, the controller 82 terminates the polishing of the semiconductor wafer 10 since the semiconductor wafer 10 has been polished down to the polishing endpoint layer 20 thereby creating a planar surface for subsequent fabrication processes.

A polishing procedure 300 utilized by the polishing system 30 to polish the semiconductor wafer 10 according to the present invention is shown in FIG. 3. The polishing procedure 300 begins with step 302 in which the controller 82 causes the polishing system 30 to begin polishing the front side 38 of the semiconductor wafer 10 in order to remove material therefrom. In particular, the controller 82 actuates the platen motor 40 in order to cause the platen assembly 42 to be rotated. Thereafter, the controller 82 actuates the wafer carrier motor 58 thereby causing the wafer carrier 54 and hence the semiconductor wafer 10 to be rotated so as to rub the front side 38 of the semiconductor wafer 10 against the rotating platen assembly 42. The controller 82 also actuates the displacement mechanism 60 in order to cause the displacement mechanism 60 to selectively move the wafer carrier 54 and hence the wafer 10 along a predetermined polishing path. Moreover, the controller 82 causes the chemical slurry supply system 72 to apply chemical slurry to the polishing pad 50 of the platen assembly 42 in order to facilitate the removal of material from the front side 38 of the semiconductor wafer 10. The procedure 300 then advances to step 304.

In step 304, the controller 82 causes effluent from the polishing area of the platen assembly 42 to be advanced through to the extraction conduit 152 of the endpoint detection system 150. In particular, the controller 82 communicates with the slurry extractor 154 in order to provide for a flow of effluent from the polishing area of the platen assembly 42 to the endpoint detection system 150. It should be appreciated that the flow of effluent from the polishing area of the platen assembly 42 to the endpoint detection system 150 can be pulsed or continuous. It should also be appreciated that the controller 82 may be programmed such that a predetermined amount of time lapses subsequent to when the wafer 10 begins to be polished prior to extracting effluent. The predetermined amount of time is close to, but less than, an estimated amount of time required for the polishing system 30 to reach the polishing endpoint layer 20. Waiting until the polishing system 30 is relatively close to the polishing endpoint layer 20 before extracting effluent reduces the number of samples which must be analyzed by the analyzer 160 of the endpoint detection system 150. The procedure 300 then advances to step 306.

In step 306, the controller 82 causes the extraction flow control 154 of the endpoint detection system 150 to introduce effluent extracted from the platen assembly 42 through the filter mechanism 156, the nebulizer 158, and into the analyzer 160. The analyzer 160 then analyzes the effluent in order to determine whether the metallic reporting substance of the polishing endpoint layer 20 is present in the effluent. The procedure 300 then advances to step 308.

In step 308, the controller 82 determines if the wafer 10 has been polished down to the polishing endpoint layer 20. In particular, if the analyzer 160 detects presence of the metallic reporting substance of the polishing endpoint layer 20, the analyzer 160 generates an endpoint detection control signal which is communicated to the controller 82. Hence, if the analyzer 160 generates an endpoint detection control signal, the procedure 300 advances to step 310. If the analyzer 160 has not generated an endpoint detection control signal, the procedure 300 loops back to step 304 to extract additional effluent for introduction into the endpoint detection system 150 in the manner previously discussed.

In step 310, the controller 82 ceases polishing of the wafer 10. In particular, the controller 82 communicates with the platen motor 40, the wafer carrier motor 58, the displacement mechanism 60, and the slurry flow control 76 in order to cease polishing of the semiconductor wafer 10. However, it should be appreciated that the controller 82 may allow the polishing system 30 to continue polishing the semiconductor wafer 10 for a short, predetermined amount of time subsequent to generation of the endpoint detection control signal in order to further remove material from the semiconductor wafer 10. This further removal of material or overpolishing may be desirable after certain steps of a fabrication process. The procedure 300 then ends thereby placing the polishing system 30 in an idle state until actuated to polish a subsequent semiconductor wafer.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected. For example, as discussed above, rather than denoting the polishing end point with the appearance of the metallic reporting substance, the polishing end point could be denoted by the reduction or disappearance of the metallic reporting substance. Specifically, denoting the polishing end point with the reduction of the metallic reporting substance works well with the dual damascene technique of fabricating a semiconductor wafer.

What is claimed is:

1. A method of planarizing a semiconductor wafer having a polishing endpoint layer that includes a metallic reporting substance, comprising the steps of:

polishing a first side of said wafer in order to remove material from said wafer;

utilizing an atomic absorption spectroscopic technique to detect the presence of said metallic reporting substance in said material removed from said wafer; and terminating said polishing step in response to detecting the presence of said metallic reporting substance.

2. The method of claim 1, wherein:

said terminating step includes the step of detecting an increase in the concentration of said metallic reporting substance.

3. The method of claim 1, wherein:

said terminating step includes the step of detecting a decrease in the concentration of said metallic reporting substance.

4. The method of claim 1, further comprising the step of:

forming said polishing endpoint layer a distance from a substrate of said wafer.

5. The method of claim 4, wherein:

said forming step includes the step of chemically depositing said polishing endpoint layer at said distance from said substrate of said wafer.

6. The method of claim 1, wherein:

said atomic absorption spectroscopic technique utilizes a flame atomic absorption spectrophotometer or a flameless atomic absorption spectrophotometer.

7. The method of claim 1, wherein:

said polishing step includes the step of applying a slurry to said first side of said wafer, said slurry receiving said material removed from said wafer, and said detecting step includes the step of analyzing said slurry with said atomic absorption spectroscopic technique to determine whether said metallic reporting substance is present in said slurry.

8. The method of claim 1, wherein:

said metallic reporting substance includes a metallic element selected from the group consisting of tungsten, aluminum, titanium, copper, lead, iron, gold, and silver.

9. A method of planarizing a semiconductor wafer to a distance from a semiconductor substrate of said wafer, comprising the steps of:

forming in said wafer a metallic reporting substance that is at said distance from said substrate of said wafer;

polishing a first side of said wafer in order to remove material from said wafer;

utilizing an atomic absorption spectroscopic technique to detect the presence of said metallic reporting substance in said material removed from said wafer; and terminating said polishing step in response to detection of said metallic reporting substance.

10. The method of claim 9, wherein:

said terminating step includes the step of detecting an increase in the concentration of said metallic reporting substance.

11. The method of claim 9, wherein:

said terminating step includes the step of detecting a decrease in the concentration of said metallic reporting substance.

12. The method of claim 9, wherein:

said forming step includes the step of chemically depositing said metallic reporting substance at said distance from said substrate of said wafer.

13. The method of claim 9, wherein:

said atomic absorption spectroscopic technique utilizes a flame atomic absorption spectrophotometer or a flameless atomic absorption spectrophotometer.

14. The method of claim 9, wherein:

said polishing step includes the step of applying a slurry to said first side of said wafer, said slurry receiving said material removed from said wafer, and said detecting step includes the step of analyzing said slurry with said atomic absorption spectroscopic technique to determine whether said metallic reporting substance is present in said slurry.

15. The method of claim 9, wherein:

said metallic reporting substance includes a metallic element selected from the group consisting of tungsten, aluminum, titanium, copper, lead, iron, gold, and silver.

16. An apparatus for polishing a semiconductor wafer down to a metallic reporting substance of said wafer, said wafer having a first side and a second side, comprising:

a polishing platen having a polishing surface;

a wafer carrier configured to (i) engage said wafer by said second side of said wafer and (ii) press said first side of said wafer against said polishing surface of said polishing platen;

a slurry supply system configured to apply a chemical slurry to said first side of said wafer which (i) facilities removal of said metallic reporting substance from said wafer, and (ii) receives said metallic reporting substance removed from said wafer, wherein said polishing platen and said wafer carrier are configured to rub said first side of said wafer against said polishing surface in the presence of said chemical slurry in order to remove said metallic reporting substance from said wafer; and a polishing endpoint detector that (i) utilizes an atomic absorption spectroscopic technique to detect the presence of said metallic reporting substance in said material removed from said wafer, and (ii) is operable so as to cause said polishing of said wafer to terminate in response to detecting the presence of said metallic reporting substance.

17. The apparatus of claim 16, wherein said polishing endpoint detector comprises:

a slurry extractor that is operable to extract said chemical slurry from said polishing platen.

18. The apparatus of claim 16, wherein said polishing endpoint detector comprises:

an analyzer which is operable to detect a change in the concentration of said metallic reporting substance in said chemical slurry from said polishing platen.

19. The apparatus of claim 16, further comprising:

a nebulizer operable to atomize said chemical slurry prior to said polishing endpoint detector utilizing said atomic absorption spectroscopic technique to detect the presence of said metallic reporting substance in said material removed from said wafer.

20. The apparatus of claim 16, wherein:

said metallic reporting substance includes a metallic element selected from the group consisting of tungsten, aluminum, titanium, copper, lead, iron, gold, and silver.

* * * * *